(12) United States Patent
Deng

(10) Patent No.: US 9,524,865 B2
(45) Date of Patent: Dec. 20, 2016

(54) SEMICONDUCTOR DEVICE AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventor: Hao Deng, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/722,979

(22) Filed: May 27, 2015

(65) Prior Publication Data
US 2015/0348777 A1 Dec. 3, 2015

(30) Foreign Application Priority Data
May 29, 2014 (CN) .......................... 2014 1 0234152

(51) Int. Cl.
*H01L 21/02* (2006.01)
*H01L 21/768* (2006.01)
(Continued)

(52) U.S. Cl.
CPC ... *H01L 21/02164* (2013.01); *H01L 21/02208* (2013.01); *H01L 21/02211* (2013.01); *H01L 21/02274* (2013.01); *H01L 21/31111* (2013.01); *H01L 21/31144* (2013.01); *H01L 21/76801* (2013.01); *H01L 21/76802* (2013.01); *H01L 21/76826* (2013.01); *H01L 23/53223* (2013.01);
(Continued)

(58) Field of Classification Search
None
See application file for complete search history.

(56) References Cited

U.S. PATENT DOCUMENTS

2004/0214451 A1* 10/2004 Johnson ................ C23C 16/401
                                                                  438/788
2006/0154494 A1*  7/2006 Qi ......................... C23C 16/045
                                                                  438/787

(Continued)

*Primary Examiner* — Asok K Sarkar
(74) *Attorney, Agent, or Firm* — Anova Law Group, PLLC

(57) ABSTRACT

The present disclosure provides a method for forming a semiconductor device. The method includes providing a substrate and forming a dielectric layer on the substrate by a deposition process using reactant gases. The reactant gases include a silicon-source gas and an oxygen-source gas under a radio-frequency (RF) power. The deposition process performed for a total deposition time to form the dielectric layer is divided into a first time length, a second time length and a third time length. The RF power of the deposition process in the first time length is a first power, the first power gradually increases from the first power to a second power in the second time length, the RF power in the third time length is the second power, and the first power is less than the second power.

17 Claims, 7 Drawing Sheets

(51) Int. Cl.
*H01L 23/532* (2006.01)
*H01L 21/311* (2006.01)

(52) U.S. Cl.
CPC .... *H01L 23/53238* (2013.01); *H01L 23/53266* (2013.01); *H01L 23/53295* (2013.01); *H01L 2924/0002* (2013.01)

(56) References Cited

U.S. PATENT DOCUMENTS

| | | | |
|---|---|---|---|
| 2006/0166515 A1* | 7/2006 | Karim | C23C 16/045 438/788 |
| 2007/0264791 A1* | 11/2007 | Han | C23C 16/045 438/424 |
| 2010/0099271 A1* | 4/2010 | Hausmann | C23C 16/345 438/778 |
| 2012/0100722 A1* | 4/2012 | Asai | C23C 16/08 438/758 |
| 2014/0209562 A1* | 7/2014 | LaVoie | C23C 16/045 216/2 |
| 2016/0155676 A1* | 6/2016 | Kang | C23C 16/345 438/5 |

* cited by examiner

SEMICONDUCTOR DEVICE AND FABRICATION METHOD THEREOF

CROSS-REFERENCES TO RELATED APPLICATIONS

This application claims the priority of Chinese Patent Application No. 201410234152.8, filed on May 29, 2014, the entire content of which is incorporated herein by reference.

FIELD OF THE DISCLOSURE

The present disclosure generally relates to the field of semiconductor technology, and more particularly, relates to a semiconductor device and fabrication method thereof.

BACKGROUND

As the integrated circuit (IC) technology moves forward to very large-scale integration (VLSI) circuits, circuit density of the ICs increases rapidly. More and more semiconductor components/devices are included into one IC structure, and an increased number of interconnects are included into the IC structure. Accordingly, more areas are needed on a silicon wafer to provide more space for arranging interconnects.

To meet the demands of the increased number of interconnects on a silicon wafer and for miniaturization of integrated circuits, conventionally, multi-layered interconnects are often used to provide adequate interconnection capacity for all of the semiconductor devices. A semiconductor structure having the multi-layered interconnects often includes a substrate and a zeroth metal layer or metal layer 0 (M0) in the substrate. The metal layer 0 (M0) is electrically connected to source/drain regions or a gate structure region of the semiconductor device. A conventional semiconductor device also includes a dielectric layer on the substrate to provide electrical isolation between adjacent metal layers. Through-holes are formed in the dielectric layer to expose surface portions of the metal layer 0 (M0) at the bottoms of the through-holes. A first metal layer or metal layer one (M1) fills up the through-holes. The first metal layer is electrically connected to the zeroth metal layer (M0).

However, electrical properties of the semiconductor devices having conventional multi-layered interconnects still need to be improved.

BRIEF SUMMARY OF THE DISCLOSURE

One aspect of the present disclosure provides a method for forming a semiconductor device. The method includes providing a substrate and forming a dielectric layer on the substrate by a deposition process using reactant gases. The reactant gases include a silicon-source gas and an oxygen-source gas under a radio-frequency (RF) power. The deposition process performed for a total deposition time to form the dielectric layer is divided into a first time length, a second time length and a third time length. The RF power of the deposition process in the first time length is a first power, the first power gradually increases from the first power to a second power in the second time length, the RF power in the third time length is the second power, and the first power is less than the second power.

Another aspect of the present disclosure provides a semiconductor device. The semiconductor device includes a substrate and a dielectric layer on the substrate. The dielectric layer is formed by introducing reactant gases including a silicon-source gas and an oxygen-source gas into a deposition chamber. A total deposition time of the deposition is divided into a first time length, a second time length, and a third time length. The deposition includes an RF power, wherein an RF power in the first time length is a first power, the RF power in the second time length increases gradually from the first power to a second power, the RF power in the third time length is the second power, and the first power is less than the second power.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

The disclosed methods and devices are directed to improve electrical properties of semiconductor devices. For example, formation of bump defects on the surface of the dielectric layer, which often causes adverse effects to the resultant semiconductor devices, may be prevented.

A semiconductor device formed by a conventional fabrication process may have inferior electrical properties. It has been found that a main factor for causing inferior electrical properties in the semiconductor device is that the interconnect structures formed in the semiconductor device have abnormal electrical properties. Sometimes, even bridges between adjacent metal layers can be formed. As a result, abnormal electrical properties of the interconnect structures can result in the semiconductor to have inferior electrical properties.

Figure 1:
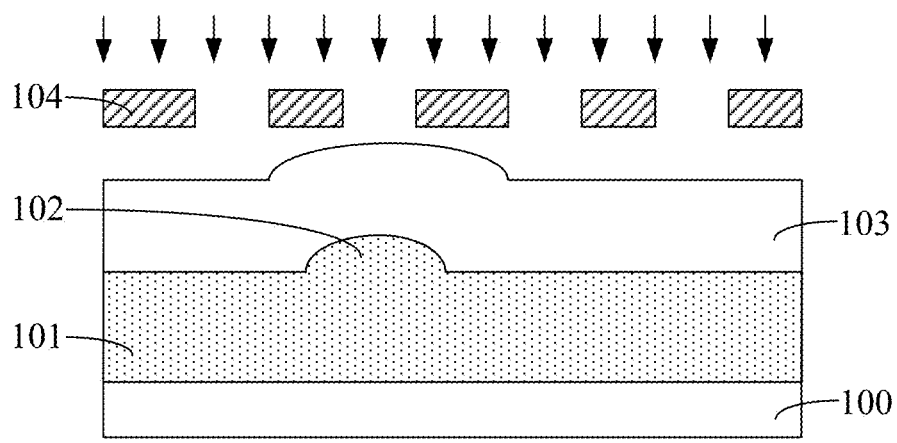
FIGS. 1 and 2 illustrate cross-section views of a semiconductor device with conventional interconnects.
Figure 2:
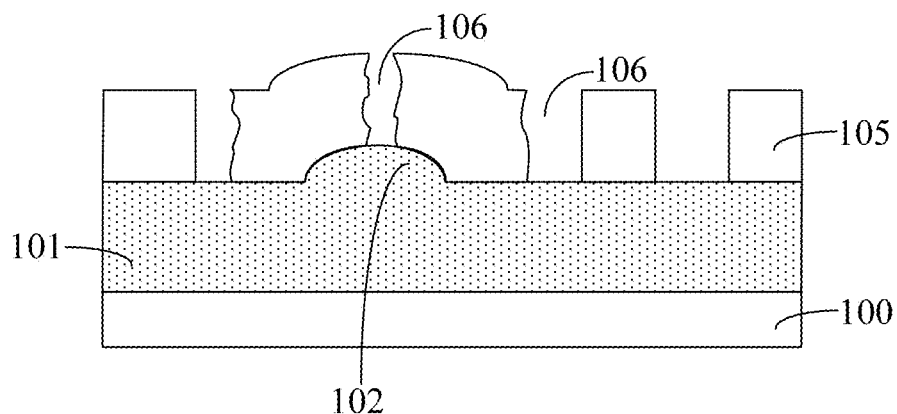

A conventional method for forming the semiconductor device is described as follows. As shown in FIG. 1, first, a substrate 100 is provided to include conductive layers in the substrate 100. A dielectric layer 101 is formed on the substrate and a photoresist layer 103 is formed on the dielectric layer 101. Further, a patterned mask layer 104 is used to expose the photoresist layer 103. As shown in FIG. 2, after the photolithography process, a patterned photoresist layer 105 is formed through forming openings 106 in the photoresist layer 103. Subsequent fabrication steps may include using the patterned photoresist layer 105 as the etch mask to etch the dielectric layer 101 to expose portions of the surface of the conductive layer in the substrate and form through-holes. Further, a metal layer is formed to fill up the through-holes.

To improve the density of the dielectric layer 101 and improve the reliability of the semiconductor device by using the fabrication method described above, a PECVD (plasma-enhanced chemical vapor deposition) is often used to form the dielectric layer 101. The formation process of the dielectric layer 101 includes microscopic processes of nucleation and nuclei growth. Under corresponding deposition condition, the nucleation rate is desirably high, and the nucleation rate increases as the RF power (i.e., the RF power of the PECVD process) increases. Once a nucleus is formed on the substrate 100, the nucleus may grow to form a larger nucleus. However, in the PECVD process, it may be difficult to ensure all nuclei to be formed simultaneously across the substrate. For example, certain locations sometimes have a higher rate of nucleation and some nuclei (i.e., the nuclei formed at locations with a higher rate of nucleation) are formed earlier than others (i.e., the nuclei formed at locations with a lower rate of nucleation). As a result, a nucleus formed earlier often has a much greater volume than a nucleus formed at a later time. Therefore, a bump defect 102 can be formed on the dielectric layer 101.

The bump defect 102 formed on the dielectric layer 101 can cause the photoresist layer 103 to have a corresponding bump defect. When a photolithography process is performed on the photoresist layer 103, the corresponding bump defect on the photoresist layer 103 may cause portions of the photoresist layer 103 to undergo undesired exposure. The undesired exposure may further cause openings 106 with undesired shapes or surfaces to be formed in the patterned photoresist layer 105. As a result, after filling the openings 106 with the metal layer, bridges may be formed between adjacent metal layers and/or the semiconductor device may have abnormal electrical properties.

Therefore, if the nucleation rate can be reduced at the initial stage of the formation process of the dielectric layer 101, nucleus with a greater volume at certain locations on the substrate can be prevented from being formed. Formation of defect bumps on the dielectric layer 101 can then be effectively suppressed/reduced.

The present disclosure provides a method for forming the semiconductor device. First, a substrate is provided, and a dielectric layer can be formed on the substrate. The reactant gases to form the dielectric layer include a silicon-source gas and an oxygen-source gas. The total deposition time is divided into a first time length, a second time length and a third time length. The RF power of the PECVD process in the first time length is a first power. The RF power of the PECVD process in the second time length increases from the first power to a second power, and the RF power of the PECVD process in the third time length is the second power. Since at the initial stage of the PECVD process, the RF power is sufficiently low, the nucleation rate is low. Thus, at the initial stage of the PECVD process, the nucleation rate is low and nucleus with a much greater volume can be prevented from being formed at certain locations on the substrate. Bump defects can be effectively prevented, and the dielectric layer can have a desirably flat surface. The electrical properties of the semiconductor device can be improved.

Figure 15:
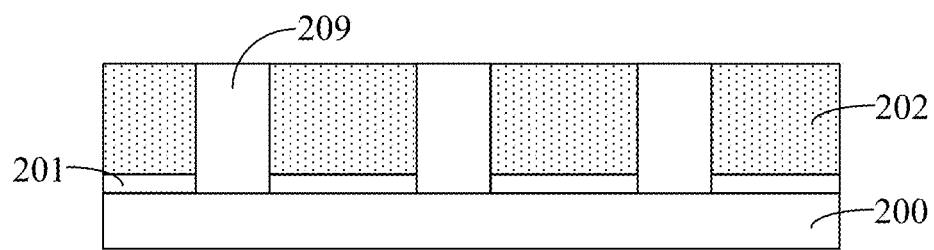
Figure 16:
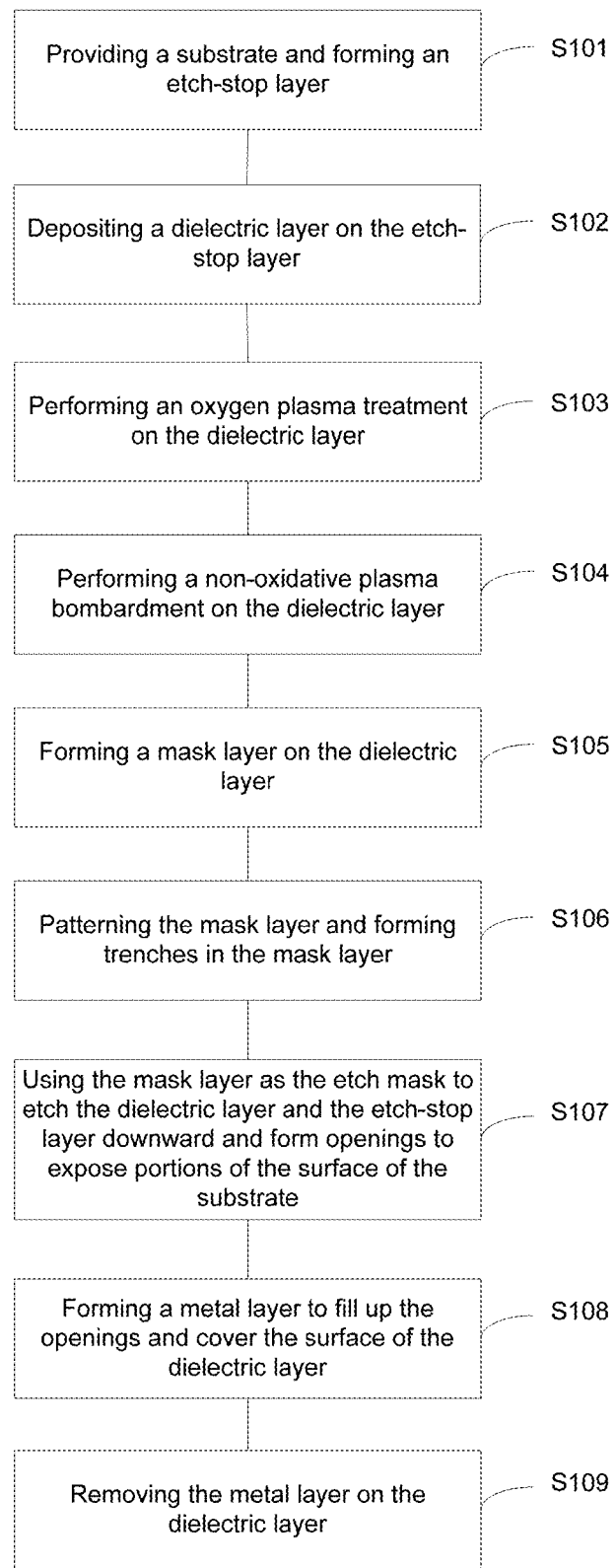
FIG. 16 illustrates an exemplary fabrication process of a semiconductor device consistent with various disclosed embodiments.

FIG. 16 illustrates an exemplary fabrication process of a semiconductor device. FIGS. 3-15 illustrate structures of a semiconductor device corresponding to certain stages of the fabrication process.

Figure 3:
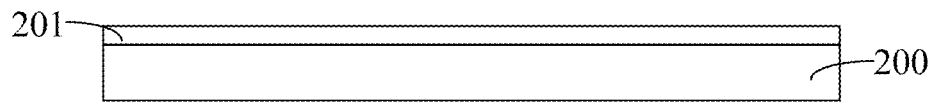
FIGS. 3, 4, and 7-15 illustrate cross-section views of a semiconductor device corresponding to certain stages of an exemplary fabrication process consistent with various disclosed embodiments.

As shown in FIG. 16, at the beginning of the fabrication process, a substrate is provided and an etch-stop layer is formed on the substrate (S101). FIG. 3 illustrates a corresponding cross-section view of the semiconductor device.

As shown in FIG. 3, a substrate 200 can be provided.

The substrate 200 can be made of single-crystal silicon, poly-crystal silicon, and/or amorphous silicon. The substrate 200 can also be made of silicon on insulator (SOI). The substrate 200 can also be made of Ge, GeSi, and/or GaAs.

Semiconductor components, such as MOS transistors, can be formed in the substrate 200. A metal wiring layer can also be formed in the substrate 200. The metal wiring layer can be connected to the subsequently-formed interconnect structure. The metal wiring layer can also be used to electrically connect external components and/or other metal layers.

In one embodiment, the substrate 200 can be made of Si.

As shown in FIG. 3, an etch-stop layer 201 can be formed on the substrate 200.

The etch-stop layer 201 can be used to protect the substrate 200 from being overly etched in subsequent fabrication steps. After the dielectric layer is formed, openings need to be subsequently formed in the dielectric layer to expose portions of the surface of the substrate. Since the etch rate on the etch-stop layer is much lower than the etch rate on the dielectric layer, the etch-stop layer can slow down the etching process significantly and prevent the substrate 200 from being overly etched. The reliability of the semiconductor device can be enhanced/improved.

The etch-stop layer 201 can be made of one or more of $Si_3N_4$, carbon-containing $Si_3N_4$, and/or carbon-containing silicon oxynitride.

Figure 4:
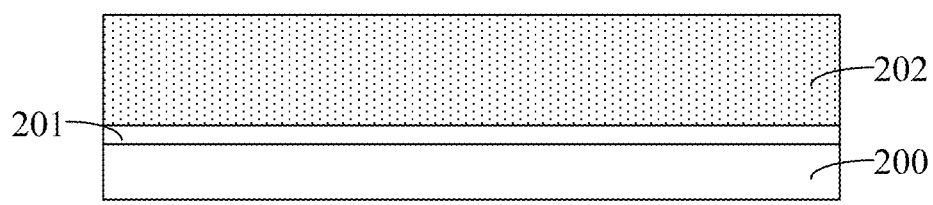

Returning to FIG. 16, after providing the substrate and forming the etch-stop layer, a dielectric layer is deposited on the etch-stop layer (S102). FIG. 4 illustrates a corresponding cross-section view of the semiconductor device.

As shown in FIG. 4, a dielectric layer 202 can be formed on the etch-stop layer.

In other embodiments of the present disclosure, if an etch-stop layer is not formed on the substrate, the dielectric layer can be formed directly on the substrate.

The reactant gases to form the dielectric layer 202 can include a silicon-source gas and an oxygen-source gas. The deposition time to form the dielectric layer 202 can be divided into consecutive first time length, second time length, and third time length. The total deposition time to form the dielectric layer can be the sum of the first time length, the second time length, and the third time length. An RF power can be provided in the deposition process to form the dielectric layer 202. The RF power in the first time length can be a first power, the RF power in the second time length can increase gradually from the first power to a second power, and the RF power in the third time length can stay at the second power. The first power can be less than the second power. That is, at the initial stage of the deposition process (i.e., in the first time length), a lower RF power may be applied. Applying a lower RF power at the initial stage of the deposition process can include several advantages.

The probability of forming bump defects can be reduced. Since the RF power may ionize the reactant gases, the value of the RF power can be proportionally dependent on the degree of ionization. Thus, the value of the RF power can be proportional to the deposition rate. The deposition rate can also be proportionally dependent on the nucleation rate. If the RF power is low at the initial stage of the deposition process, the nucleation rate can be low to prevent nucleus with a much greater volume from being formed at certain locations of the etch-stop layer 201. Growth of a nucleus to form nucleus with an even greater volume can also be prevented. The probability of forming bump defects can be reduced.

Further, in one embodiment, in the deposition process to form the dielectric layer 202, a non-oxidative diluent gas can be introduced into the deposition chamber. The non-oxidative diluent gas does not participate in any chemical reactions in the deposition chamber. The diluent gas can dilute the concentrations of the reactant gases and reduce the overall concentrations of the reactant gases in the deposition chamber. A reduction in the concentrations of the reactant gases can help form nuclei more uniformly or improve the uniformity of nucleation rate across the etch-stop layer 201. Non-uniformly formed nuclei on the etch-stop layer 201 can be prevented/reduced. The probability of forming bump defects can be further prevented and the flatness of the dielectric layer 202 can be improved.

The first time length and the third time length can be any suitable non-zero time lengths. The lengths of the first time length and the third interval can be determined according to fabrication requirements.

When the first time length is zero, the second time length can include a nucleation stage and a nuclei growth stage. Since the value of the RF power can increase gradually from the first power to the second power in the second time length, the value of the RF power can be desirably low at the nucleation stage. The nucleation rate in the nucleation stage can be sufficiently low. In addition, the introduction of the non-oxidative diluent gas into the chamber can enable uniform nucleation rate and uniform nuclei growth rate. The desirably low nucleation rate, uniform nucleation rate, and uniform nuclei growth rate can enable the dielectric layer 202 to form a desirable surface flatness. Bump defects on the surface of the dielectric layer 202 can be prevented/reduced.

If the first time length is greater than zero, the first time length may include the nucleation stage. The nucleation rate can be low and the introduction of the non-oxidative diluent gas can enable a uniform nucleation rate. The uniform nucleation rate can also enable the dielectric layer 202 to form a desirable surface flatness.

Figure 5:
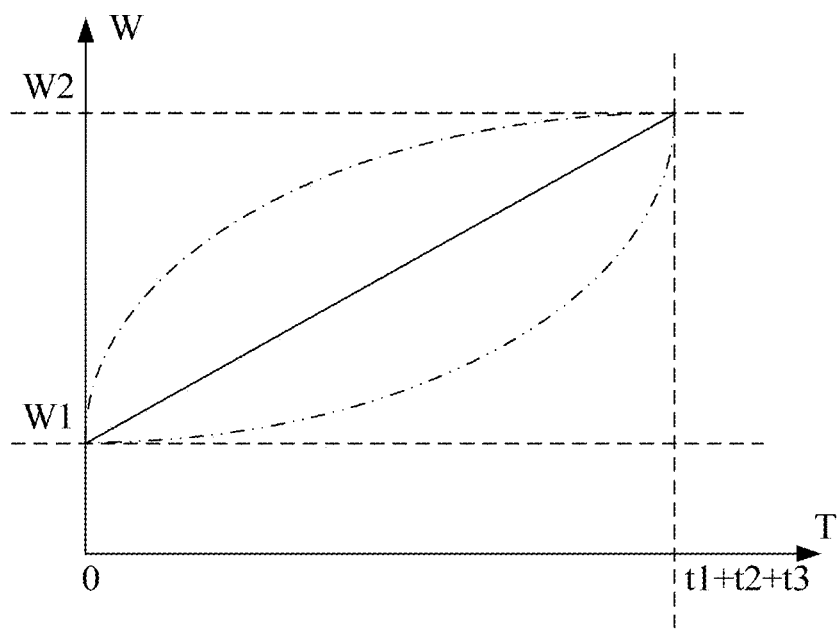
FIGS. 5 and 6 illustrate variation of exemplary RF power as a function of time consistent with various disclosed embodiments.
Figure 6:
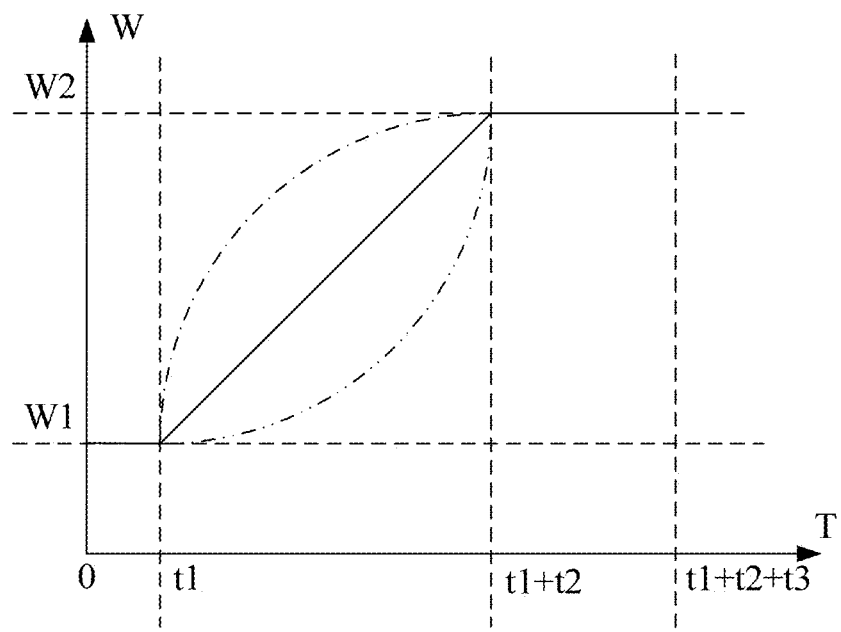

As shown in FIGS. 5 and 6, the x axis in FIGS. 5 and 6 each represents the deposition time, and the y axis of FIGS. 5 and 6 each represents the value of the RF power to form the dielectric layer. Thus, FIGS. 5 and 6 each illustrates variation of the RF power as a function of time. The first time length t1 and the third time length t3 are both zero in FIG. 5, and the first time length t1 and the third time length t3 are both greater than zero in FIG. 6. The value of the RF power can increase gradually from the first power W1 to the second power W2, and the increase can be linear, parabolic, or exponential. The slope k1 (not shown) of the linear increase can be dependent on the difference between the second power W2 and the first power W1 and on the second time length t2. For example, the slope k1 may equal to the ratio of the power difference (W2−W1) to the second time length t2.

It should be noted that if the first time length t1 and the third time length t3 are greater than zero, the length of the second time length t2 should not be overly short to avoid drastic increase of the RF power in the second time length. Thus, drastic increase of the nucleation rate can be avoided. A slow/mild change in RF power can thus enable the dielectric layer 202 to form a surface of desirable flatness.

If the first power is undesirably high, the nucleation rate can be too high to reduce the formation of bump defects on the dielectric layer. If the first power is undesirably low, output of the RF generator (used for generating the RF power) may not be stable, and the quality of the nuclei can be adversely affected. Also, if the first power is undesirably low, the nucleation rate may be too low, and the quality of the nuclei may also be degraded. Thus, in one embodiment, the first power can be about 50 W to about 100 W, and the second power can be about 300 W to about 600 W.

A PECVD process can be used to form the dielectric layer 202 (shown in FIG. 4). In one embodiment, the parameters of the PECVD process can include: a silicon-source gas with a flow rate of 40 sccm to 100 sccm, an oxygen-source gas with a flow rate of 8000 sccm to 16000 sccm, a non-oxidative diluent gas with a flow rate of 2000 sccm to 6000 sccm, and a deposition chamber pressure of 0.6 Torr to 2 Torr. Also, the total deposition time can be divided into consecutive first time length, second time length, and third time length. The RF power in the first time length can be the first power, the RF power in the second time length can increase gradually from the first power to the second power, and the RF power in the third time length can be the second power. The first power may be less than the second power. The first power can be about 50 W to about 100 W, and the second power can be about 300 W to about 600 W.

The unit sccm represents standard cubic centimeters per minute. The flow rate can increase in a linear, parabolic, or exponential manner. The silicon-source gas can be $SiH_4$, $SiH_2Cl_2$, and/or $SiHCl_3$. The oxygen-source gas can be $O2$ and/or $N_2O$. The non-oxidative diluent gas can be $H_2$, He, Ne, Xe, Kr, and/or Ar.

In the deposition process to form the dielectric layer 202, since a non-oxidative diluent gas can be introduced into the deposition chamber, the concentrations of the reactant gases can be reduced to enable a uniform nucleation rate. Also, the RF power of the PECVD process can increase gradually from the first power to the second power. Since the RF power at the initial stage of the deposition process is low, the nucleation rate at the initial stage of the deposition can be desirably low to prevent some nucleus from being formed at certain locations of the etch-stop layer at an earlier time than other nucleus. In addition, the nucleation rate can be uniform and desirably low at the nucleation stage of the deposition process to prevent bump defects from being formed across the surface of the dielectric layer 202. Therefore, the dielectric layer 202 can be formed with sufficient flatness.

The dielectric layer 202 can be made of $SiO_2$, nitrogen-containing $SiO_2$, carbon-containing $SiO_2$ and/or carbon-nitrogen-containing $SiO_2$.

Figure 7:
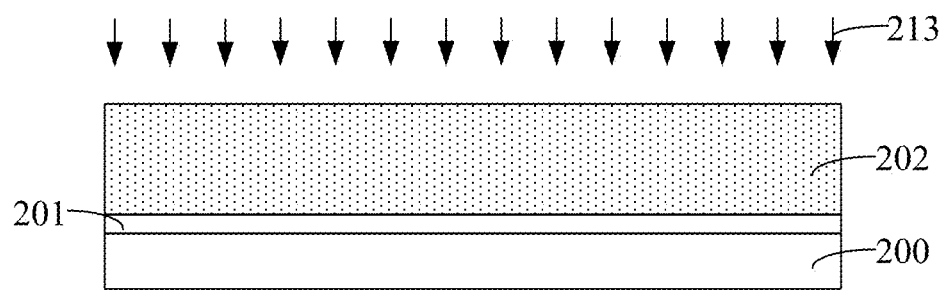

Returning to FIG. 16, after depositing the dielectric layer on the etch-stop layer, an oxygen plasma treatment is performed on the dielectric layer (S103). FIG. 7 illustrates a corresponding cross-section view of the semiconductor device.

As shown in FIG. 7, an oxygen plasma treatment 213 can be performed on the dielectric layer 202.

After forming the dielectric layer 202 by using the PECVD process, some silicon-source molecules/atoms that are not oxidized in the deposition process to form the SiO$_2$, may remain on the surface of the dielectric layer 202. That is, silicon-source residue may remain on the dielectric layer 202 and may adversely affect the flatness of the dielectric layer 202. When the silicon-source residue is not distributed uniformly across the surface of the dielectric layer 202, the residue may cause bump defects to form and adversely affect the electrical properties of subsequently-formed interconnects.

Therefore, in one embodiment, after the dielectric layer 202 is formed, an oxygen plasma treatment 213 can be performed on the dielectric layer 202 to consume/remove the silicon-source residue on the dielectric layer 202 to eliminate potential adverse effect caused by the silicon-source residue.

In one embodiment, the parameters of the oxygen plasma treatment 213 can include a plasma gas containing a mixture of ionized O$_2$ and N$_2$O. The flow rate of the mixture can be about 50 sccm to about 500 sccm, and the RF power can be about 100 W to about 600 W.

Figure 8:
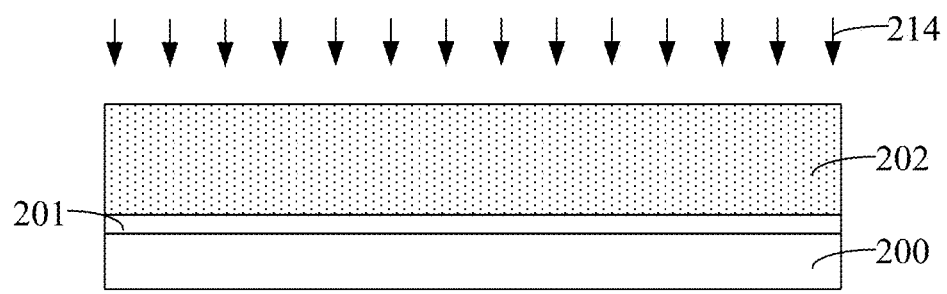

Returning to FIG. 16, after performing the oxygen plasma treatment on the dielectric layer, a non-oxidative plasma bombardment is performed on the dielectric layer (S104). FIG. 8 illustrates a corresponding cross-section view of the semiconductor device.

As shown in FIG. 8, a non-oxidative plasma bombardment 214 can be performed on the dielectric layer 202.

The non-oxidative plasma bombardment 214 can enable ions with high energy to bombard the surface of the dielectric layer 202 and further flatten the surface of the dielectric layer 202 to reduce the probability of forming bump defects.

In one embodiment, the parameters of the non-oxidative plasma bombardment 214 can include ionized gases containing H$_2$, He, Ne, Xe, Kr and/or Ar. The flow rate of H$_2$, He, Ne, Xe, Kr and/or Ar can be about 50 sccm to about 500 sccm. The RF power can be about 100 W to about 600 W.

Figure 9:
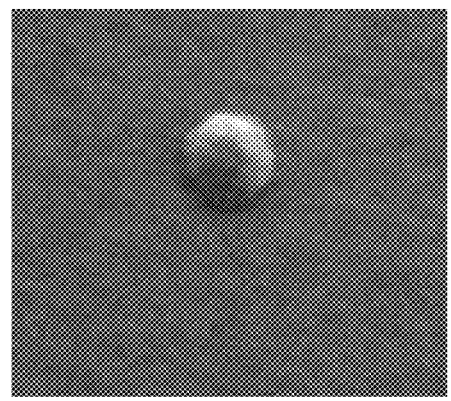
Figure 10:
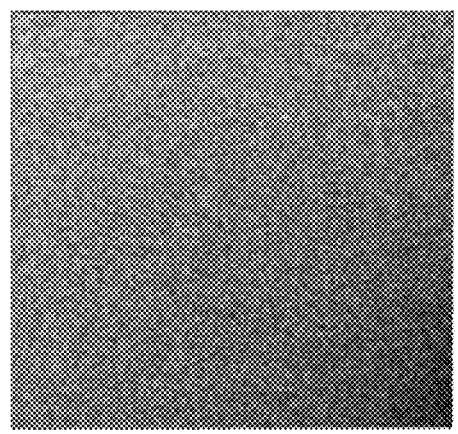

As shown in FIG. 9, an SEM (scanning electron microscope) image taken from the surface of a dielectric layer of a conventional semiconductor device shows a bump defect is formed. FIG. 10 shows an SEM image taken from the surface of a dielectric layer of a semiconductor device in one embodiment of the present disclosure. Images in FIGS. 9 and 10 were taken under the same resolution. The surface of the dielectric layer formed using the fabrication method of the present disclosure has desirable flatness and no bump defects can be observed. The comparison shows the dielectric layer formed by using the method of the present disclosure may have higher quality and more desirable surface flatness.

Openings can be subsequently formed in the dielectric layer 202 and the etch-stop layer 201. The openings can be dual-Damascus openings or single-Damascus openings. For illustrative purposes, single-Damascus openings are described below to exemplify the embodiments provided by the present disclosure.

Figure 11:
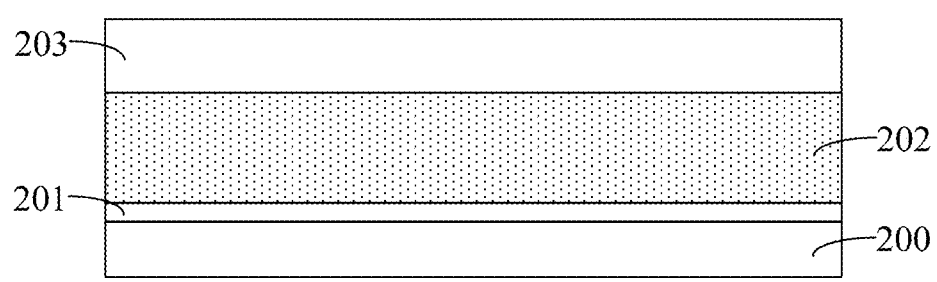

Returning to FIG. 16, after performing the non-oxidative plasma bombardment on the dielectric layer, a mask layer is formed on the dielectric layer (S105). FIG. 11 illustrates a cross-section view of the corresponding semiconductor device.

As shown in FIG. 11, a mask layer 203 can be formed on the dielectric layer 202.

The mask layer 203 can be single-layered or multiple-layered. When the mask layer 203 is single-layered, the mask layer 203 can be made of photoresist, Si$_3$N$_4$, and/or metal. In one embodiment, the mask layer 203 can be single-layered, and the mask layer 203 can be made of photoresist.

Since the dielectric layer 202 may have improved flatness, the mask layer 203 formed on the dielectric layer 202 may also have improved flatness.

Figure 12:
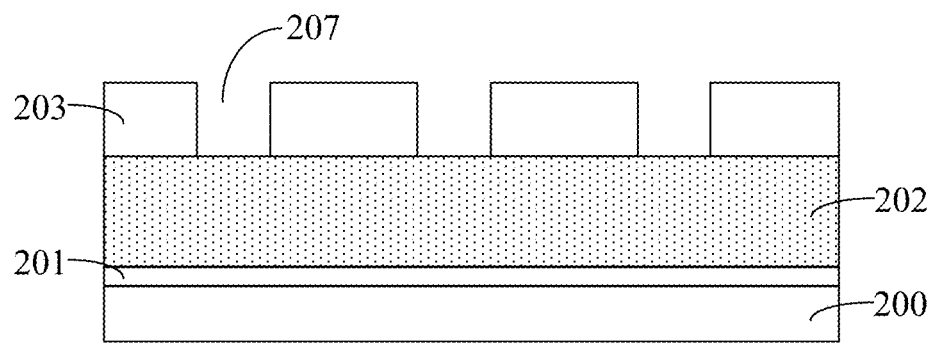

Returning to FIG. 16, after forming the mask layer on the dielectric layer, the mask layer is patterned to form trenches in the mask layer (S106). FIG. 12 illustrates a cross-section view of the corresponding semiconductor device.

As shown in FIG. 12, the mask layer 203 can be patterned to form trenches 207 in the mask layer 203. Bottoms of the trenches 207 may expose portions of the surface of the dielectric layer 202.

Specifically, a photolithography process can be performed to form the trenches 207 in the mask layer 203. Locations and shapes of the trenches 207 may correspond to the locations and shapes of the subsequently-formed openings.

In one embodiment, since the surface of the dielectric layer 202 has a desirable flatness, the trenches 207 formed in the mask layer 203 after the patterning process may have desirable locations and shapes.

However, in a semiconductor device formed by a conventional fabrication method, if bump defects are formed on the dielectric layer, bump defects can also be formed on the mask layer (i.e., formed on the dielectric layer) at corresponding locations. Properties of the patterned mask layer can be adversely affected. In addition, bump defects on the surface of the dielectric layer may cause the photoresist layer to undergo undesired exposure in the photolithography process such that the locations and shapes of the trenches after the patterning process may deviate from the original design. The subsequently-formed interconnect structure may have abnormal electrical properties and bridges between adjacent metal layers may be formed.

Figure 13:
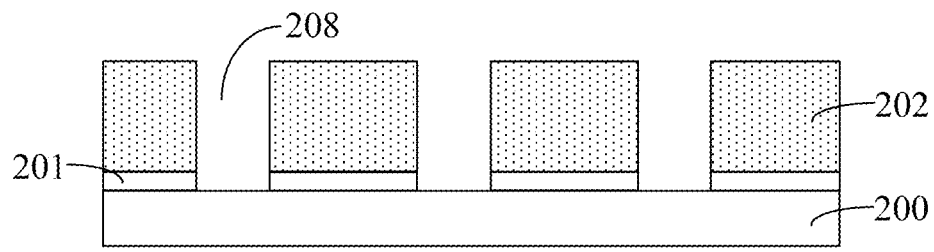

Returning to FIG. 16, after patterning the mask layer and forming the trenches in the mask layer, the dielectric layer and the etch-stop layer are etched by using the mask layer as the etch mask. The dielectric layer and the etch-stop layer are etched downward to form openings to expose portions of the surface of the substrate (S107). FIG. 13 illustrates a cross-section view of the corresponding semiconductor device.

As shown in FIG. 13, the dielectric layer 202 and the etch-stop layer 201 can be etched by using the mask layer 203. The dielectric layer 202 and the etch-stop layer 201 can be etched downward to form openings and expose portions of the surface of the substrate 200. Openings 208 can be formed in the dielectric layer 202, and the openings 208 can expose portions of the surface of the substrate 200.

Since the trenches 207 may have desirable locations and shapes, the openings 208 formed by etching the trenches 207 downward may also have desirable locations and shapes as designed. Deviations of the locations and shapes of the openings can be prevented/reduced. In one embodiment, a dry etch process can be used to form the openings 208.

Figure 14:
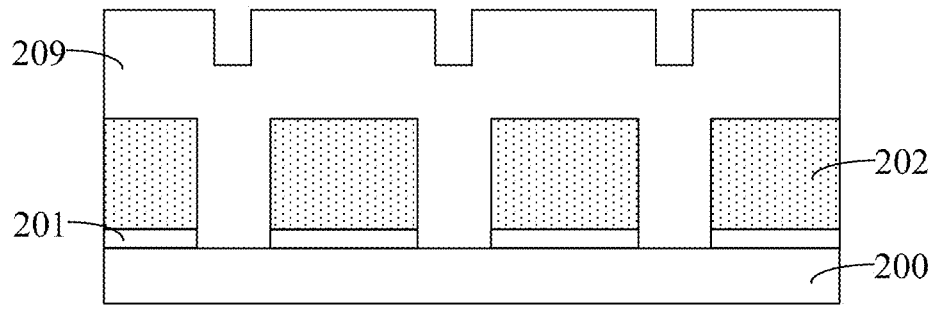

Returning to FIG. 16, after etching the dielectric layer and the etch-stop layer to form openings and expose portions of the surface of the substrate, a metal layer is formed to fill up the openings and to cover the surface of the dielectric layer (S108). FIG. 14 illustrates a cross-section view of the corresponding semiconductor device.

As shown in FIG. 14, a metal layer 209 can be formed to fill up the openings 208 (as shown in FIG. 13) and cover the surface of the dielectric layer 202. The metal layer 209 can be single-layered or multiple-layered.

If the metal layer 209 is single-layered, the metal layer 209 can include the portion of the metal layer 209 filling up the openings 208 and the portion of the metal layer 209 covering the surface of the dielectric layer 202. The metal layer 209 can be made of Cu, Al, and/or W.

If the metal layer 209 is multiple-layered, the metal layer 209 may include a barrier layer covering the bottoms and sidewalls of the openings 208 and the surface of the dielectric layer 202, a seed layer on the barrier layer, and a metal layer on the seed layer.

The barrier layer can prevent copper atoms from diffusing from the seed layer and the metal layer into the substrate 200 or into the dielectric layer 202 to cause contamination. Electrical properties of the interconnect structure can thus be improved. Also, the barrier layer can provide desirable interface condition for the seed layer such that the seed layer can have desirably high adhesion to the barrier layer. The barrier layer can be made of one or more of Ti, Ta, W, TiN, TaN, TiSiN, TaSiN, WN, and/or WC.

The seed layer can be the cathode in the subsequent electroplating process to form the metal layer. The seed layer can also provide desirable interface for the subsequently-formed metal layer such that the metal layer can have desirably high adhesion to the seed layer. Electromigration of the interconnect structure can be improved accordingly.

The seed layer can be single-layered or multiple-layered. If the seed layer is multiple-layered, it can be formed by seed grains with varying sizes (e.g., smaller seed grains and larger seed grains). For a multiple-layered seed layer, smaller seed grains can be formed under the larger seed grains to improve the adhesion between the seed layer and the barrier layer. The metal layer can be made of Cu, Al, and/or W. The metal layer can be formed by a physical vapor deposition process or an electroplating process.

Returning to FIG. 16, after forming the metal layer to fill up the openings and cover the surface of the dielectric layer, the metal layer on the dielectric layer is removed (S109). FIG. 15 illustrates a cross-section view of the corresponding semiconductor device.

As shown in FIG. 15, the metal layer 209 covering the surface of the dielectric layer 209 can be removed.

In one embodiment, a chemical mechanical polishing process can be performed to polish the metal layer 209 until the top surface of the dielectric layer 202 is exposed.

Since the dielectric layer 202 can have desirably high flatness after the polishing process, the metal layer 209 can also have desirable locations and shapes as designed. Abnormal electrical properties of the interconnect structures or bridges between adjacent metal layers can be prevented.

Figure 17:
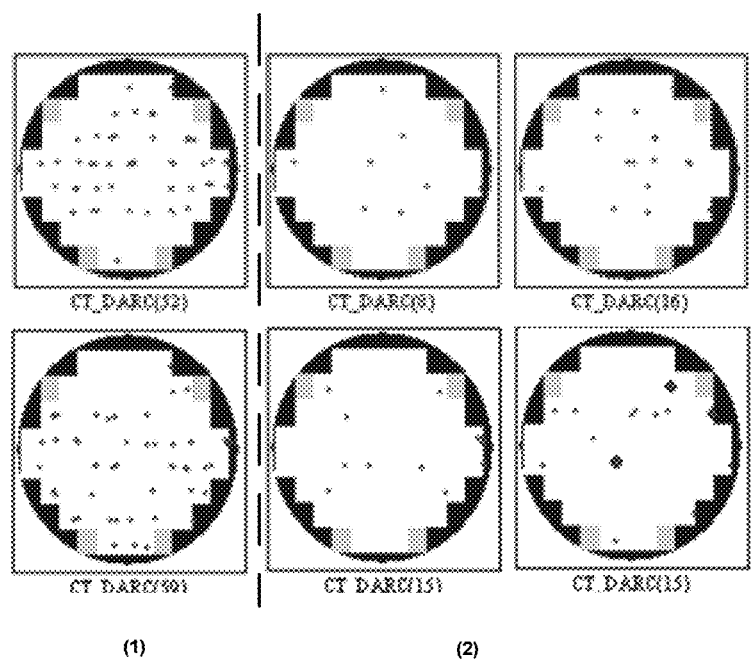
FIG. 17 compares bump defect results when using different fabrication methods consistent with various disclosed embodiments.

FIG. 17 illustrates a comparison between semiconductor devices formed by a conventional fabrication method and semiconductor devices formed by the disclosed method, separated by the dashed line. It can be shown that bump defects formed on the semiconductor devices formed by the disclosed method are considerably less than the bump defects formed on the semiconductor devices by the conventional fabrication method. Thus, surface flatness of the disclosed semiconductor devices can be greatly improved.

Thus, the disclosed method for fabricating the semiconductor device provides several advantages.

First, the semiconductor fabrication method includes providing a substrate and forming a dielectric layer on the substrate. The reactant gases to form the dielectric layer include a silicon-source gas and an oxygen-source gas. The deposition time is divided into a first time length, a second time length and a third time length. The RF power of the PECVD process in the first time length is a first power; the RF power of the PECVD process in the second time length increases gradually from the first power to a second power; and the RF power of the deposition in the third time length is the second power (the first power is less than the second power). Since at the initial stage of the deposition the RF power is sufficiently low, ionization rate of the reactant gases are low, the reaction rate between the silicon-source gas and the oxygen-source gas are sufficiently low, and the nucleation rate is desirably low. Thus, the nucleation rate is sufficiently low to prevent formation of some nucleus at certain locations with much greater volumes than nucleus formed at other locations. Bump defects can be prevented and the dielectric layer can have improved surface flatness.

Meanwhile, a non-oxidative diluent gas is introduced into the deposition chamber in the embodiments of the present disclosure. The non-oxidative diluent gas can dilute concentrations of the reactant gases and reduce overall reactant gas concentrations in the deposition chamber. The reduced reactant gas concentrations can enable the nucleation to be formed more uniformly on the surface of the etch-stop layer. That is, nucleation rate is uniform on the surface of the etch-stop layer (or substrate if no etch-stop layer formed) to prevent formation of bump defects caused by considerably great differences in nucleation rate among nucleus. Thus, embodiments provided in the present disclosure can further reduce the probability of forming bump defects and improve the surface flatness of the dielectric layer.

Further, an oxygen plasma treatment is performed on the dielectric layer to consume and remove the silicon-source residue on the dielectric layer, and the surface properties of the dielectric layer can be further improved. In various embodiments of the present disclosure, a non-oxidative plasma bombardment is performed on the dielectric layer to further flatten the surface of the dielectric layer. The flatness of the dielectric layer can then be further improved.

Further, in the semiconductor device treated with the above processes, openings are formed in the dielectric layers. A metal layer is formed to fill up the openings and to cover the surface of the dielectric layer. Since the dielectric layer already has desirable surface flatness and few bump defects are formed/observed, adverse effect on the patterned mask layer caused by the bump defects can be prevented. Thus, the patterned mask layer formed on the dielectric layer can have desirably high quality, and the openings can have desirable locations and shapes. Abnormal electrical properties of the interconnect structure or bridges between adjacent metal layers can be prevented.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

What is claimed is:

1. A method for forming a semiconductor device, comprising:
   providing a substrate; and
   forming a dielectric layer on the substrate by a deposition process using reactant gases including a silicon-source gas and an oxygen-source gas under a radio-frequency (RF) power, wherein:
   the deposition process performed for a total deposition time to form the dielectric layer is divided into a first time length, a second time length and a third time length; and
   the RF power of the deposition process in the first time length is a first power, the first power gradually increases from the first power to a second power in the second time length, the RF power in the third time length is the second power, and the first power is less than the second power.

2. The method according to claim 1, further including introducing a non-oxidative diluent gas into a deposition chamber during the deposition process for forming the dielectric layer.

3. The method according to claim 2, wherein the non-oxidative diluent gas includes $H_2$, He, Ne, Xe, Kr, Ar, or a combination thereof.

4. The method according to claim 1, wherein the RF power plasmatizes the reactant gases.

5. The method according to claim 1, wherein the third time length includes a zero time length.

6. The method according to claim 1, wherein:
when the first time length is zero, the second time length includes a nucleation stage and a nuclei growth stage for forming the dielectric layer; and
when the first time length is greater than zero, the first time length includes a nucleation stage and a nuclei growth stage for forming the dielectric layer.

7. The method according to claim 1, wherein the RF power of the deposition process in the second time length gradually increases in a linear, parabolic, or exponential manner from the first power to the second power.

8. The method according to claim 1, wherein the deposition process includes a plasma-enhanced chemical vapor deposition to form the dielectric layer.

9. The method according to claim 8, wherein the plasma-enhanced chemical vapor deposition process includes a flow rate of the silicon-source gas of about 40 sccm to about 100 sccm; a flow rate of the oxygen-source gas of about 8000 sccm to about 16000 sccm; a flow rate of a non-oxidative diluent gas of about 2000 sccm to about 6000 sccm; a pressure of a deposition chamber of about 0.6 Torr to about 2 Torr; the first power of about 50 W to about 100 W; and the second power of about 300 W to about 600 W.

10. The method according to claim 1, wherein the silicon-source gas includes $SiH_4$, $SiH_2Cl_2$, $SiHCl_3$, or a combination thereof; and the oxygen-source gas includes $O_2$, $N_2O$, or a combination thereof.

11. The method according to claim 1, wherein the dielectric layer is surface-treated with an oxygen plasma treatment, and parameters of the oxygen plasma treatment include: a plasma gas including a mixture of ionized $O_2$ and $N_2O$ having a flow rate of about 50 sccm to about 500 sccm; and an RF power of about 100 W to about 600 W.

12. The method according to claim 1, wherein the dielectric layer is surface-treated with a non-oxidative plasma bombardment, and parameters of the non-oxidative plasma bombardment include: an ionized gas including $H_2$, He, Ne, Xe, Kr, Ar, or a combination thereof; a flow rate of the ionized gas of about 50 sccm to about 500 sccm; and an RF power of about 100 W to about 600 W.

13. The method according to claim 1, further including forming an etch-stop layer between the substrate and the dielectric layer.

14. The method according to claim 1, further including:
forming a patterned mask layer on the dielectric layer;
using the patterned mask layer as an etch mask to etch the dielectric layer to expose portions of a surface of the substrate and form openings in the dielectric layer; and
forming a metal layer to fill up the openings.

15. The method according to claim 14, wherein the patterned mask layer is made of photoresist, $Si_3N_4$, metal, or a combination thereof.

16. The method according to claim 14, wherein the openings are single-Damascus openings, dual-Damascus openings, or a combination thereof.

17. The method according to claim 14, wherein the metal layer is made of Cu, Al, W, or a combination thereof.

* * * * *